United States Patent
Berke et al.

(10) Patent No.: US 10,395,750 B2
(45) Date of Patent: Aug. 27, 2019

(54) SYSTEM AND METHOD FOR POST-PACKAGE REPAIR ACROSS DRAM BANKS AND BANK GROUPS

(71) Applicant: DELL PRODUCTS, LP, Round Rock, TX (US)

(72) Inventors: Stuart Allen Berke, Austin, TX (US); Vadhiraj Sankaranarayanan, Austin, TX (US)

(73) Assignee: Dell Products, LP, Round Rock, TX (US)

(*) Notice: Subject to any disclaimer, the term of this patent is extended or adjusted under 35 U.S.C. 154(b) by 0 days.

(21) Appl. No.: 15/726,179

(22) Filed: Oct. 5, 2017

(65) Prior Publication Data

US 2019/0108892 A1    Apr. 11, 2019

(51) Int. Cl.
*G11C 11/24* (2006.01)
*G11C 29/44* (2006.01)
*G11C 29/00* (2006.01)
*G06F 12/06* (2006.01)

(52) U.S. Cl.
CPC ........ *G11C 29/44* (2013.01); *G06F 12/0638* (2013.01); *G11C 29/886* (2013.01); *G11C 2029/4402* (2013.01)

(58) Field of Classification Search
CPC .......... G11C 29/44; G11C 29/886; G11C 2029/4402; G06F 12/0638
See application file for complete search history.

(56) References Cited

U.S. PATENT DOCUMENTS

| 6,141,267 | A | * | 10/2000 | Kirihata | G11C 5/02 365/185.09 |
|---|---|---|---|---|---|
| 8,122,304 | B2 | | 2/2012 | Fujiwara et al. | |
| 9,030,899 | B2 | | 5/2015 | Lee | |
| 9,202,595 | B2 | | 12/2015 | Wilson et al. | |
| 9,349,491 | B1 | * | 5/2016 | Morgan | G11C 29/76 |
| 2002/0181302 | A1 | * | 12/2002 | Beer | G11C 29/808 365/200 |
| 2016/0062908 | A1 | * | 3/2016 | Shen | G11C 7/1072 711/103 |
| 2017/0062074 | A1 | * | 3/2017 | Kim | G11C 29/26 |
| 2017/0148529 | A1 | * | 5/2017 | Kim | G11C 29/44 |
| 2017/0200511 | A1 | * | 7/2017 | Warnes | G11C 29/44 |
| 2018/0247699 | A1 | * | 8/2018 | Pope | G11C 29/10 |

OTHER PUBLICATIONS

Yongshin Kim, "Server Memory Transition to DDR4 & Future Server Solutions," JEDEC Server Forum 2014 (sk hynix); pp. 1-19; https://www.jedec.org/sites/default/files/files/Yongshin_Kim_Server%20Forum_2014(2).pdf.

* cited by examiner

*Primary Examiner* — Uyen B Tran
(74) *Attorney, Agent, or Firm* — Larson Newman, LLP

(57) ABSTRACT

A dynamic random access memory (DRAM) device includes a plurality of bank groups of first storage cells, each bank group arranged as a plurality of banks, each bank arranged as a plurality of rows, and each row including a plurality of dynamic storage cells. The DRAM device further includes a post-package repair (PPR) storage array arranged as a plurality of entries, wherein the DRAM device is configured to map a first row failure in a first bank group to a first entry of the PPR storage array, and to map a second row failure in a second bank group to a second entry of the PPR storage array.

20 Claims, 4 Drawing Sheets

SYSTEM AND METHOD FOR POST-PACKAGE REPAIR ACROSS DRAM BANKS AND BANK GROUPS

FIELD OF THE DISCLOSURE

This disclosure generally relates to information handling systems, and more particularly relates to post-package repair across DRAM banks and bank groups.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A dynamic random access memory (DRAM) device may include a plurality of bank groups of first storage cells, with each bank group arranged as a plurality of banks, each bank arranged as a plurality of rows, and each row including a plurality of dynamic storage cells. The DRAM device may further include a post-package repair (PPR) storage array arranged as a plurality of entries, wherein the DRAM device is configured to map a first row failure in a first bank group to a first entry of the PPR storage array, and to map a second row failure in a second bank group to a second entry of the PPR storage array.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
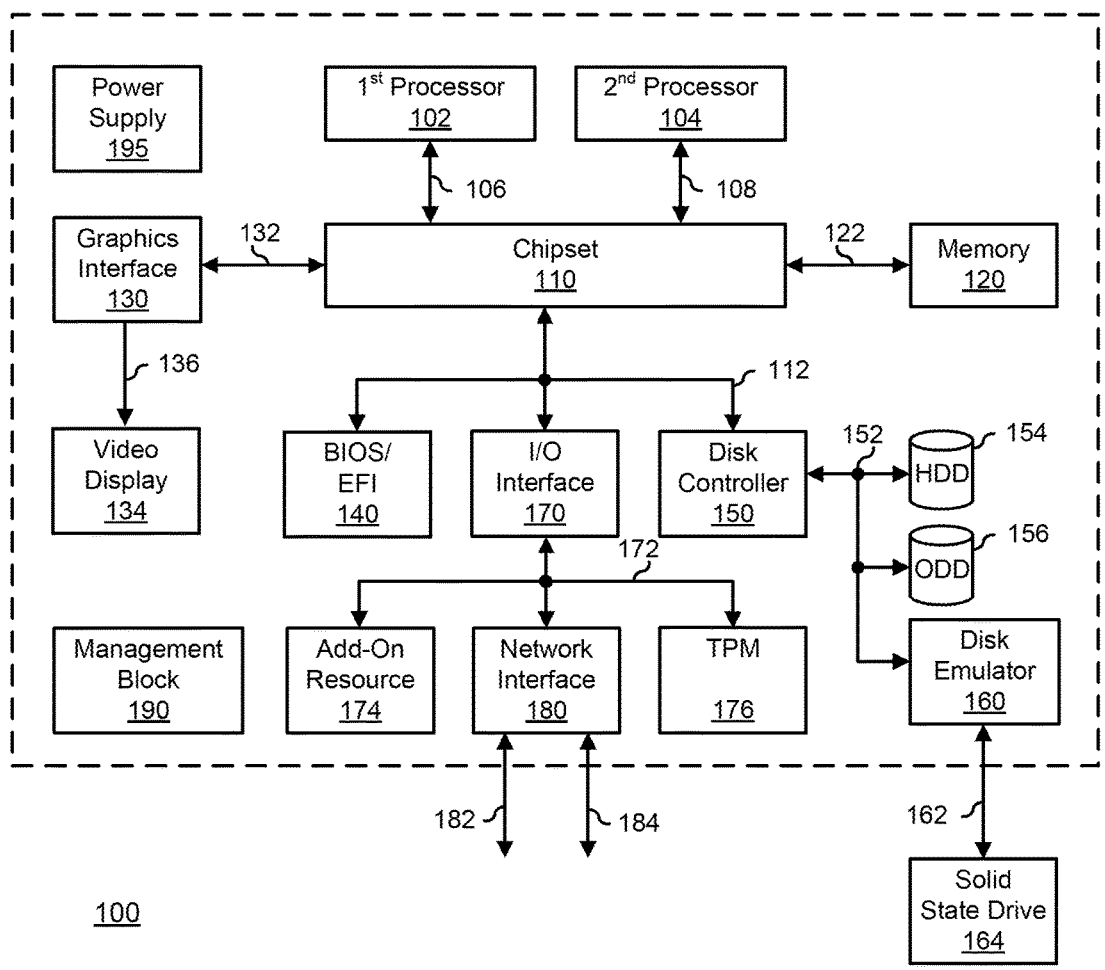
FIG. 1 is a block diagram illustrating a generalized information handling system according to an embodiment of the present disclosure.

FIG. 1 illustrates a generalized embodiment of an information handling system 100. For purpose of this disclosure information handling system 100 can be configured to provide the features and to perform the functions of the OPF system as described herein. Information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described below, and operates to perform one or more of the methods described below. Information handling system 100 includes a processors 102 and 104, a chipset 110, a memory 120, a graphics interface 130, a basic input and output system/extensible firmware interface (BIOS/EFI) module 140, a disk controller 150, a hard disk drive (HDD) 154, an optical disk drive (ODD) 156, a disk emulator 160 connected to an external solid state drive (SSD) 162, an input/output (I/O) interface 170, one or more add-on resources 174, a trusted platform module (TPM) 176, a network interface 180, a management block 190, and a power supply 195. Processors 102 and 104, chipset 110, memory 120, graphics interface 130, BIOS/EFI module 140, disk controller 150, HDD 154, ODD 156, disk emulator 160, SSD 162, I/O interface 170, add-on resources 174, TPM 176, and network interface 180 operate together to provide a host environment of information handling system 100 that operates to provide the data processing functionality of the information handling system. The host environment operates to execute machine-executable code, including platform BIOS/EFI code, device firmware, operating system code, applications, programs, and the like, to perform the data processing tasks associated with information handling system 100.

In the host environment, processor 102 is connected to chipset 110 via processor interface 106, and processor 104 is connected to the chipset via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disk controller to HDD 154, to ODD 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Management block 190 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 100. In particular, management block 190 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 100, such as system cooling fans and power supplies. Management block 190 can include a network connection to an external management system, and the management block can communicate with the management system to report status information for information handling system 100, to receive BIOS/UEFI or system firmware updates, or to perform other task for managing and controlling the operation of information handling system 100. Management block 190 can operate off of a separate power plane from the components of the host environment so that the management block receives power to manage information handling system 100 when the information handling system is otherwise shut down. An example of management block 190 may include a commercially available BMC product that operates in accordance with an Intelligent Platform Management Initiative (IPMI) specification, such as a Integrated Dell Remote Access Controller (iDRAC), or the like. Management block 190 may further include associated memory devices, logic devices, security devices, or the like, as needed or desired.

Power supply 195 represents one or more devices for power distribution to the components of information handling system 100. In particular, power supply 195 can include a main power supply that receives power from an input power source, such as a wall power outlet, a power strip, a battery, or another power source, as needed or desired. Here, power source 195 operates to convert the power at a first voltage level from the input power source to one or more power rails that are utilized by the components of information handling system. Power supply 195 can also include one or more voltage regulators (VRs) that each receive power from the main power supply and that operate to convert the input voltage to an output voltage that is used by one or more components of information handling system. For example, a VR can be provided for each of processors 102 and 104, and another VR can be provided for memory 120. Power supply 195 can be configured to provide a first power plane that provides power to the host environment, and to provide a second power plane that provides power to the management environment.

Figure 2:
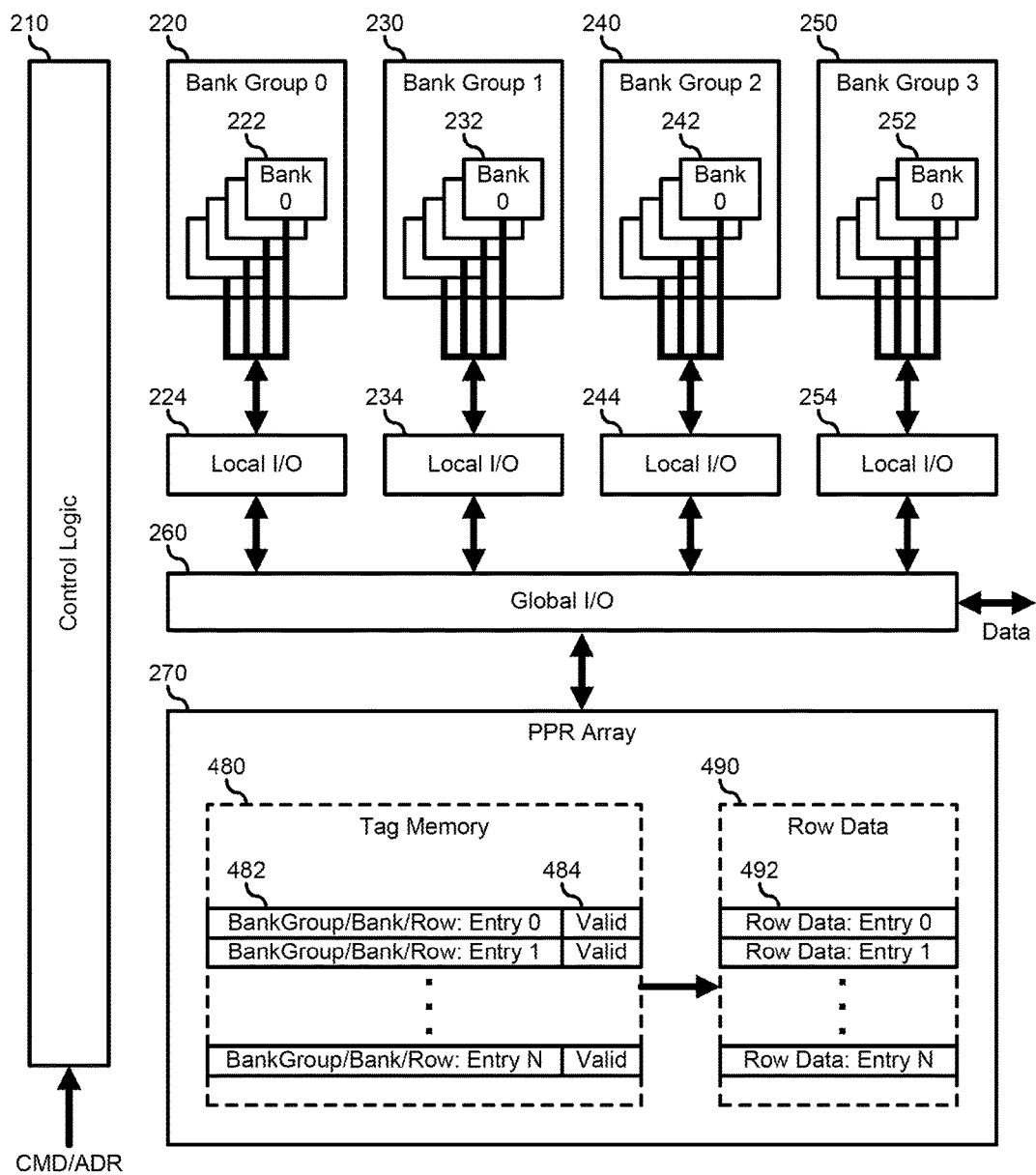
FIG. 2 is a block diagram illustrating a dynamic random access memory (DRAM) device according to an embodiment of the present disclosure.

FIG. 2 illustrates a dynamic random access memory (DRAM) device 200, including a control logic 210, memory bank groups 220, 230, 240, and 250, each with an associated local data I/O 224, 234, 244, and 254, global data I/O 260, and a post-package repair (PPR) storage array 270. DRAM device 200 represents a fourth or fifth generation Double Data Rate (DDR4 or DDR5) dynamic memory device that provides higher data transfer rates and greater Dual In-Line Memory Module (DIMM) densities than are available with the preceding DDR generations. The addition of PPR storage array 270 to DRAM device 200 permits more flexible utilization of spare memory storage cells over typical DRAM devices, as described further, below.

DRAM device 200 operates to store and retrieve data stored in a memory array of dynamic memory cells that are arranged in four bank groups 220, 230, 240, and 250. Each bank group 220, 230, 240, and 250 is further arranged in sub-arrays called banks 222, 232, 242, and 252, respectively, and each bank includes a number of rows of the dynamic memory cells. For example, where DRAM device 200 represents a 16 gigabit (Gb) DRAM device, each bank represents 1 Gb of dynamic memory cells. Further, where each row includes 4 kilobits (kb) (i.e., 4096 bits) of dynamic memory cells, then each bank will include 256 k rows of dynamic memory cells. Note that other arrangements may be utilized, as needed or desired. For example, a row may have a greater or a fewer number of dynamic memory cells, and DRAM device may have a larger or a smaller overall capacity, as needed or desired. Note that the arrangement of 16 banks in four bank groups is typical of a DDR4 DRAM device. However, the embodiments described herein do not preclude other arrangements. In particular, for a DDR5 DRAM device, the arrangement of 32 banks into eight bank groups may be similarly benefited by the addition of a single separate PPR array as describe herein.

In normal operation, control logic 210 receives information from a command/address bus (CMD/ADR). The commands may include memory read commands, memory write commands, or other commands, as needed or desired. For example, in a memory read command, the command/address bus (CMD/ADR) will include a memory address of the desired memory storage location to be read. Control logic 210 then provides the address to bank groups 220, 230, 240, and 250 that is decoded, and the dynamic memory cells from the decoded location are provided via the associated local data I/O 224, 234, 244, or 254 to global data I/O 260 for transmission to the memory controller via a data bus or serial data link (DATA). Similarly, in a memory write command, the command/address bus (CMD/ADR) will include a memory address of the desired memory storage location to be written and control logic 210 provides the address to bank groups 220, 230, 240, and 250. Bank groups 220, 230, 240, and 250 decode the address and the dynamic memory cells from the decoded location receive the write date via the associated local data I/O 224, 234, 244, or 254 from global data I/O 260.

As DRAM technology improves, newer DRAM devices may have tighter internal timing requirements, smaller process feature geometries, and greater densities than older DRAM devices. As such, newer DRAM devices are is prone to greater data retention and access failure rates. As such, DRAM device 200 includes on-die post-package repair (PPR) capabilities. PPR capabilities provide for improved reliability, availability, and serviceability (RAS) by providing spare memory storage cells, typically arranged as a number of redundant memory rows per bank group on a DRAM device. Here, when a memory controller detects errors in a particular row of a DRAM device, the controller can issue a hard or soft PPR sequence to the DRAM device to cause the DRAM device to replace the defective row with a redundant memory row from the spare memory storage cells. A hard PPR sequence results in a permanent remapping of defective memory storage cells, such as by fusing the remapping in the DRAM device. A soft PPR sequence results in a temporary remapping of defective memory storage cells that is lost when the DRAM device is reset. The particulars of detecting memory row errors in a DRAM device bank group, and the command sequences for invoking the hard and soft PPR schemes are known in the art and will not be further discussed herein, except as needed to further illustrate the present invention.

PPR storage array 270 includes a tag memory 480 and a row data memory 490. PPR storage array 270 includes a number (N) of entries that are each associated with a remapped memory row from one of bank groups 220, 230, 240, and 250. Each entry includes a map field 282 and a valid data field 284 in tag memory 280, and a row data field 292 in row data memory 290. Map field 282 provides information related to the bank group, the bank of the bank group, and the row of the bank that is remapped to the entry. For example, where each bank includes 256 k rows, each map field entry will include two-bits for identifying the bank group, two-bits for identifying the bank within the bank group, and 18-bits for identifying the row within the bank group, or a total of 22-bits to encode all of the rows of the exemplary 16 Gb DRAM device. Valid field 284 can represent a single bit that provides an indication as to whether or not the entry includes information for a validly remapped row of DRAM device 200. When valid field 284 is set for a particular entry, then memory accesses to the bank group/bank/row identified in the associated map field will be remapped to the associated entry of row data field 292. In a particular embodiment, valid field 284 can include one or more additional bits for encoding other information as needed or desired. Row data field 292 stores the remapped data from the remapped row. For example, where each row of DRAM device 200 stores 4 kb (4096 bits) of data, then each row data field will represent 4 kb (4096 bits) of data, as well.

As such, PPR storage array 270 represents a fully associative content addressable memory array that provides spare memory storage cells arranged as a number (N) of redundant memory rows that are arranged as a number (N) of redundant memory rows that are bank-group agnostic.

That is, each redundant memory row of PPR storage array 270 can be allocated to any one of bank groups 220, 230, 240, and 250. As such, PPR storage array 270 represents a common PPR resource for all of bank groups 220, 230, 240, and 250. In a particular embodiment, PPR storage array 270 is physically centrally located on a semiconductor integrated circuit die of DRAM device 200 from each of bank groups 220, 230, 240, and 250, in order that timings and latencies for memory reads and memory writes that invoke PPR storage array 270 are nearly consistent, within a design tolerance, for each of the bank groups.

It will be understood that, on a typical DRAM device, a memory controller will operate to provide refresh cycles on a per-bank-group basis. As such, in a particular embodiment, PPR storage array 270 is made up of dynamic memory cells that are configured to be refreshed consistently with the memory controller refresh cycles for bank groups 220, 230, 240, and 250. For example, because each entry of PPR storage array 270 encodes an associated bank group within map field 282, control logic 210 can utilize the two bank-group bits and provide memory refresh cycles to each entry of PPR array 270 when associated bank group 220, 230, 240, or 250 is provided with memory refresh cycles. It will be understood that DRAM device 200 can operate similarly with respect to other bank-group and row specific memory operations, such as row pre-charge, row open, and row closure operations, as needed or desired.

In another embodiment, the problem of making PPR storage array 270 agnostic to bank-group and row specific memory operations is resolved where the PPR storage array is made up of static memory cells, flip-flops, or other static storage elements. It will be understood that the use of static storage elements for PPR storage array 270 may result in a greater power consumption than would be the case for dynamic storage elements. However, given a specification that DRAM device 200 include 16 PPR entries, such as may be the case for fifth generation DDR DIMMS (DDR5), row data memory 290 would amount to a total array size of approximately 4 kb per entry times 16 entries, or 64 kb of static storage elements, and tag memory 280 would amount to less that 1 kb of static storage elements. Moreover, in a particular case, other power saving functions may be applied, such as to only provide power to the entries that have validly remapped information, or to clock PPR storage array 270 with the same, lower frequency clock that is used to clock the dynamic memory array, thereby decreasing the dynamic power consumption of the PPR storage array. Further, by utilizing static storage elements, PPR storage array 270 is not encumbered with refresh timing issues as is the case where spare storage elements are maintained in the separate banks, as in the conventional DRAM device.

DRAM device 200 provides for a soft PPR mode and for a hard PPR mode. In the soft PPR mode, the information in tag memory 280 remains persistent only until a next reset of an information handling system that includes the DRAM device. That is, upon system reset, all entries of tag memory 280 are cleared. Then, in a particular embodiment, following the system reset, the entries are repopulated based upon the detection of row failures during that particular reset cycle. In another embodiment, the contents of tag memory 280 are read, such as via a serial presence detect (SPD) mechanism by a baseboard management controller of the information handling system, and the baseboard management controller stores the contents of the tag memory to a non-volatile storage device. Then, when the information handling system is reset, the baseboard management controller retrieves the information from the non-volatile storage device, and, using the SPD mechanism, restores the information to tag memory 280. In this way, the remapping of defective memory rows is maintained across reset cycles. In the hard PPR mode, the contents of tag memory 280 are fused, such that the information remains persistent across reset cycles.

Figure 3:
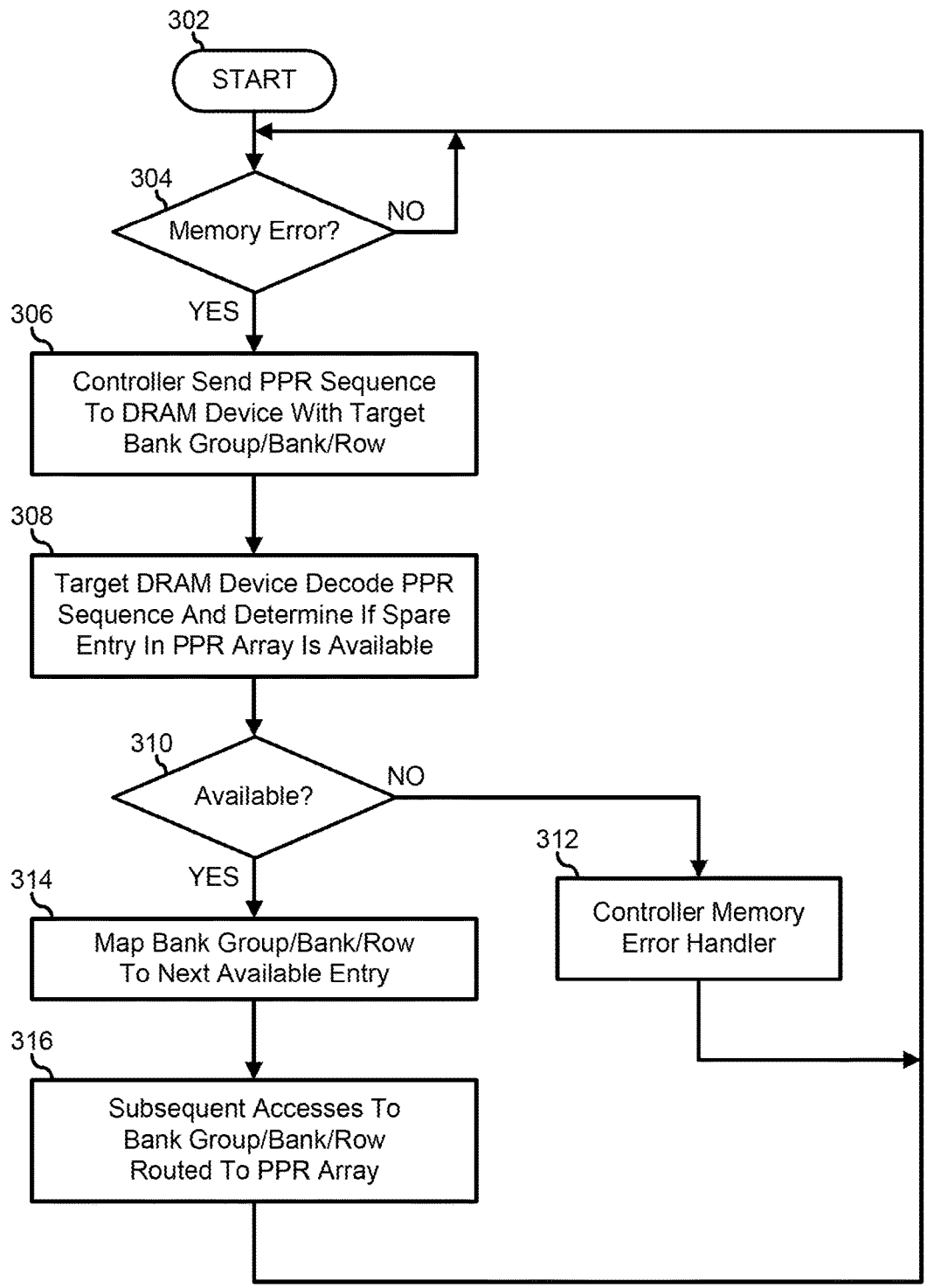
FIG. 3 is a flowchart illustrating a method for post-package repair across DRAM banks and bank groups in a DRAM device according to an embodiment of the present disclosure.

FIG. 3 illustrates a method for post-package repair across DRAM banks and bank groups in a DRAM device, starting at block 302. A decision is made as to whether or not a memory controller has detected a row error in a row of dynamic memory cells on a particular bank of a particular bank group of a DRAM device in decision block 304. If not, the "NO" branch of decision block 304 is taken and the method loops to decision block 304 until the memory controller detects a row error. When the memory controller detects a row error, the "YES" branch of decision block 304 is taken and the memory controller issues a PPR sequence to the DRAM device upon which the row error was detected in block 306. The PPR sequence includes the target row address, including the target DRAM device, the bank group on the DRAM device, the bank of the bank group, and the row of dynamic memory cells of the bank.

The target DRAM device decodes the bank group/bank/row address in the PPR sequence and determines if any spare entries in a PPR storage array are available for remapping in block 308. The DRAM device can further determine if the particular bank group/bank/row address has been previously remapped, as needed or desired. A decision is made as to whether or not a spare entry in the PPR storage array is available in decision block 310. If not, the "NO" branch of decision block 310 is taken, the memory controller invokes a memory error handler in block 312, and the method returns to decision block 304 until another row error is detected. If a spare entry in the PPR storage array is available, the "YES" branch of decision block 310 is taken, and the DRAM device maps the bank group/bank/row address to the tag memory for the entry of the PPR storage array, and sets the valid field of entry in block 314. Subsequent memory accesses to the bank group/bank/row address are decoded and routed to the PPR storage array, and the row data memory associated with the selected entry is used for storing information routed to the bank group/bank/row address in block 316, and the method returns to decision block 304 until another row error is detected.

Figure 4:
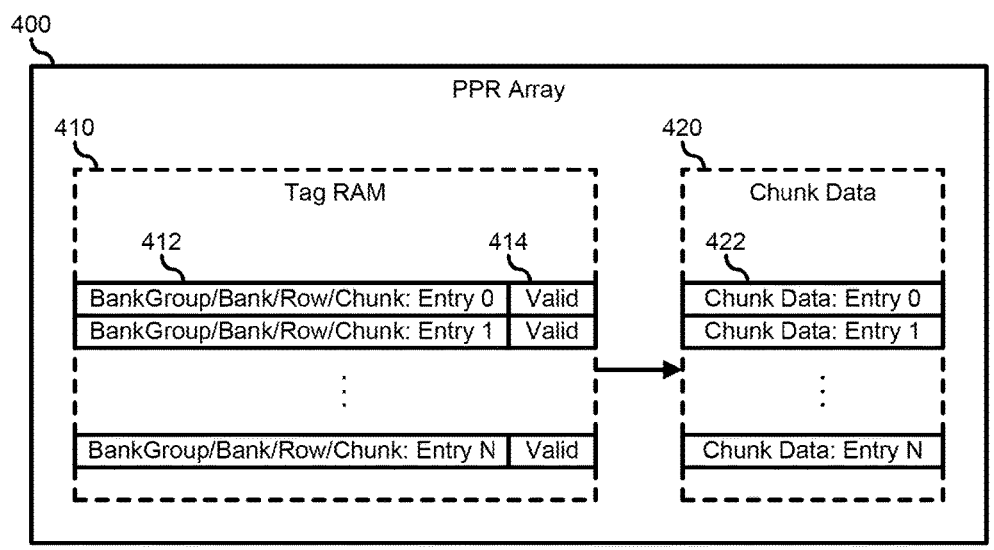
FIG. 4 is a block diagram illustrating a post-package repair storage array according to an embodiment of the present disclosure.

FIG. 4 illustrates a PPR storage array 400 according to a particular embodiment of the present disclosure. PPR storage array 400 is similar to PPR storage array 270, and a DRAM device that includes PPR storage array 400 operates similarly to DRAM device 200, as described above. In particular, PPR storage array 400 includes a tag memory 410 and chunk data memory 420, each with a number (N) of entries that are each associated with a remapped memory row from one of the bank groups of the DRAM device. Each entry includes a map field 412 and a valid data field 414 in tag memory 410, and a chunk data field 422 in row data memory 420. Map field 412 provides information related to the bank group, the bank of the bank group, the row of the bank, and a chunk within the row that is remapped to the entry. A chunk of a row represents a smaller portion of a row that can be separately mapped from the other chunks that make up the row. For example, where a row includes 4 kb (4096 bits), a chunk can represent one of various boundary conditions within each row, such as a DRAM error correcting code (ECC) block level, a DRAM burst length, or another boundary condition as needed or desired. For example, a proposed DRAM ECC block level for DDR5 DRAM devices is 128 bits, and so a chunk can be defined as blocks of 128 bits, and a 4 kb row can include 32 chunks.

In another example, a proposed DRAM burst length for DDR5 DRAM devices is 16 times the DRAM device data width. So, where a DRAM device has a 2-bit data width, a chunk can be defined as 32-bits bits, and a 4 kb row can include 128 chunks.

Valid field 414 can represent a single bit that provides an indication as to whether or not the entry includes information for a validly remapped row of the DRAM device. When valid field 414 is set for a particular entry, then memory accesses to the bank group/bank/row/chunk identified in the associated map field will be remapped to the associated entry of row data field 422. In a particular embodiment, valid field 414 can include one or more additional bits for encoding other information as needed or desired. Row data field 422 stores the remapped data from the remapped chunk. Note that, in this embodiment, the size of chunk data memory 420 can be much smaller than the associated size of row data memory 290, because each entry in the chunk data memory does not need to include the full number of bits in a whole row, but only the number of bits in a chunk. However, such reduction in size of chunk data memory 420 is achieved at the expense of added complexity in decoding map field 412. For example, where a row is divided into 128-bit chunks, map field 412 will grow by 5-bits to encode for the 32 chunks in a row. The considerations as to optimization of chunk size versus map field size versus the number (N) of entries is beyond the scope of the present disclosure.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A dynamic random access memory (DRAM) device, comprising:
   a plurality of bank groups of first storage cells, each bank group arranged as a plurality of banks, each bank arranged as a plurality of rows, and each row including a plurality of dynamic storage cells; and
   a post-package repair (PPR) storage array arranged as a plurality of entries, each entry being associated with a PPR row, each PPR row including a plurality of dynamic storage cells, wherein the DRAM device is configured to map a first row failure from a first row in a first bank group to a first entry of the PPR storage array, to store first row data associated with the first row in a first PPR row associated with the first entry, to map a second row failure from a second row in a second bank group to a second entry of the PPR storage array, and to store second row data associated with the second row in a second PPR row associated with the second entry.

2. The DRAM device of claim 1, wherein the first entry includes a map field.

3. The DRAM device of claim 2, wherein the map field identifies the first bank group, a first bank within the first bank group, and a first row within the first bank, the first row including the first row failure.

4. The DRAM device of claim 3, wherein the map field is fused to include the first bank group, the first bank, and the first row.

5. The DRAM device of claim 3, wherein the first entry further includes a row data field configured to store data mapped from the first row.

6. The DRAM device of claim 2, wherein the map field is cleared when the DRAM device is reset.

7. The DRAM device of claim 1, wherein the first entry includes a valid field configured to indicate that the first row failure is mapped to the first entry.

8. The DRAM device of claim 1, wherein the PPR storage array includes second storage cells.

9. The DRAM device of claim 8, wherein the first storage cells comprise dynamic storage cells, and the second storage cells comprise static storage cells.

10. The DRAM device of claim 8, wherein the first and second storage cells comprise dynamic storage cells.

11. A method, comprising:
    arranging a dynamic random access memory (DRAM) device as a plurality of bank groups of first storage cells, each bank group arranged as a plurality of banks, each bank arranged as a plurality of rows, and each row including a plurality of dynamic storage cells;
    arranging a post-package repair (PPR) storage array of the DRAM device as a plurality of entries, each entry being associated with a PPR row, each PPR row including a plurality of dynamic storage cells;
    mapping, by the DRAM device, a first row failure in a first bank group to a first entry of the PPR storage array;
    storing first row data associated with the first row in a first PPR row associated with the first entry;
    mapping, by the DRAM device, a second row failure in a second bank group to a second entry of the PPR storage array; and
    storing second row data associated with the second row in a second PPR row associated with the second entry.

12. The method of claim 11, wherein the first entry includes a map field.

13. The method of claim 12, wherein the map field identifies the first bank group, a first bank within the first bank group, and a first row within the first bank, the first row including the first row failure.

14. The method of claim 13, further comprising:
    fusing the map field to include the first bank group, the first bank, and the first row.

15. The method of claim 13, wherein the first entry further includes a row data field, the method further comprising:
    configuring the row data field to store data mapped from the first row.

16. The method of claim 12, further comprising:
    clearing the map field when the DRAM device is reset.

17. The method of claim 11, wherein the first entry includes a valid field, the method further comprising:
    configuring the valid field to indicate that the first row failure is mapped to the first entry.

18. The method of claim 11, wherein the PPR storage array includes second storage cells, and wherein the first storage cells comprise dynamic storage cells, and the second storage cells comprise static storage cells.

19. The method of claim 11, wherein the PPR storage array includes second storage cells, and wherein the first and second storage cells comprise dynamic storage cells.

20. A dynamic random access memory (DRAM) device, comprising:
- a plurality of bank groups of first storage cells, each bank group arranged as a plurality of banks, each bank arranged as a plurality of rows, each row arranged as a plurality of chunks, and each chunk including a plurality of dynamic storage cells; and
- a post-package repair (PPR) storage array arranged as a plurality of entries, each entry being associated with a PPR chunk, each PPR chunk including a plurality of dynamic storage cells, wherein the DRAM device is configured to map a first chunk failure from a first chunk in a first bank group to a first entry of the PPR storage array, to store first chunk data associated with the first chunk in a first PPR chunk associated with the first entry, to map a second chunk failure from a second chunk in a second bank group to a second entry of the PPR storage array, and to store second chunk data associated with the second chunk in a second PPR chunk associated with the second entry.

* * * * *